(12) United States Patent
Hwang et al.

(10) Patent No.: US 8,796,737 B2
(45) Date of Patent: Aug. 5, 2014

(54) HIGH ELECTRON MOBILITY TRANSISTORS AND METHODS OF MANUFACTURING THE SAME

(75) Inventors: In-jun Hwang, Hwaseong-si (KR);
Jai-kwang Shin, Anyang-si (KR);
Jae-joon Oh, Seongnam-si (KR);
Jong-bong Ha, Yongin-si (KR);
Hyuk-soon Choi, Hwaseong-si (KR);
Ki-ha Hong, Cheonan-si (KR)

(73) Assignee: Samsung Electronics Co., Ltd., Gyeonggi-Do (KR)

(\*) Notice: Subject to any disclaimer, the term of this patent is extended or adjusted under 35 U.S.C. 154(b) by 56 days.

(21) Appl. No.: 13/307,769

(22) Filed: Nov. 30, 2011

(65) Prior Publication Data

US 2012/0280244 A1 Nov. 8, 2012

(30) Foreign Application Priority Data

May 6, 2011 (KR) ........................ 10-2011-0043082

(51) Int. Cl.
*H01L 29/66* (2006.01)
*H01L 21/338* (2006.01)

(52) U.S. Cl.
USPC ............ 257/194; 257/E29.246; 257/E21.403; 438/172

(58) Field of Classification Search
USPC ............ 257/194, E29.246, E21.403; 438/172
See application file for complete search history.

(56) References Cited

U.S. PATENT DOCUMENTS

| | | | |
|---|---|---|---|
| 6,391,696 B1 | 5/2002 | Onda | |
| 7,709,859 B2 | 5/2010 | Smith et al. | |
| 2006/0019435 A1* | 1/2006 | Sheppard et al. | 438/167 |
| 2007/0158692 A1* | 7/2007 | Nakayama et al. | 257/213 |
| 2007/0278519 A1 | 12/2007 | Baudet et al. | |
| 2008/0093626 A1* | 4/2008 | Kuraguchi | 257/190 |
| 2010/0025730 A1* | 2/2010 | Heikman et al. | 257/194 |
| 2011/0089468 A1* | 4/2011 | Zhang | 257/194 |
| 2011/0272742 A1* | 11/2011 | Akiyama et al. | 257/194 |

FOREIGN PATENT DOCUMENTS

| | | |
|---|---|---|
| JP | 2007067240 A | 3/2007 |
| JP | 2009231396 A | 10/2009 |
| KR | 20070091629 A | 9/2007 |

OTHER PUBLICATIONS

Wang et al., "Low Damage, Cl$_2$-Based Gate Recess Etching for 0.3-μm Gate-Length AlGaN/GaN HEMT Fabrication", IEEE Electron Device Letters, vol. 25, No. 2, Feb. 2004, pp. 52-54.

Hays et al., "Selective dry etching using inductively coupled plasmas Part II. InN/GaN and InN/AlN", Applied Surface Science 147 (1999), pp. 134-139.

Ibbetson et al., "Polarization effects, surface states, and the source of electrons in AlGaN/GaN heterostructure field effect transistors", Applied Physics Letters, Jul. 10, 2000, pp. 249-252.

\* cited by examiner

*Primary Examiner* — Lex Malsawma (74) *Attorney, Agent, or Firm* — Harness, Dickey & Pierce, P.L.C.

(57) ABSTRACT

High electron mobility transistors (HEMTs) and methods of manufacturing the same. A HEMT may include a channel layer and a channel supply layer, and the channel supply layer may be a multilayer structure. The channel supply layer may include an etch stop layer and an upper layer on the etch stop layer. A recess region may be in the upper layer. The recess region may be a region recessed to an interface between the upper layer and the etch stop layer. A gate electrode may be on the recess region.

25 Claims, 9 Drawing Sheets

HIGH ELECTRON MOBILITY TRANSISTORS AND METHODS OF MANUFACTURING THE SAME

CROSS-REFERENCE TO RELATED APPLICATION

This application claims the benefit of Korean Patent Application No. 10-2011-0043082, filed on May 6, 2011, in the Korean Intellectual Property Office, the disclosure of which is incorporated herein in its entirety by reference.

BACKGROUND

1. Field

Example embodiments relate to semiconductor devices and methods of manufacturing the same, and more particularly, to high electron mobility transistors and methods of manufacturing the same.

2. Description of the Related Art

A high electron mobility transistor (HEMT) may include semiconductors with different electric polarization characteristics. In a HEMT, a semiconductor layer of relatively high polarizability may induce a 2-dimensional electron gas (2DEG) in another semiconductor layer adhered to the semiconductor layer. Electron mobility in the 2DEG may be very high and such a 2DEG may be used as a channel of the HEMT.

In order to efficiently use a HEMT in various electronic devices, it may be needed to adjust or improve the characteristics (a threshold voltage, withstand voltage characteristics, etc.) of the HEMT. In this regard, several methods for adjusting and improving the characteristics of a HEMT have been suggested. However, it is difficult to accurately control the characteristics of a HEMT.

SUMMARY

Example embodiments may include high electron mobility transistors (HEMTs), and methods of manufacturing the HEMTs, of which characteristics (e.g., threshold voltage and the like), may be easily and/or accurately controlled, and/or control may be improved. Example embodiments may include HEMTs with a multilayer structure channel supply layer and a depth of a recess region formed in the channel supply layer may be easily and/or accurately controlled, and/or control may be improved. Example embodiments may include HEMTs with improved withstand voltage performance.

According to example embodiments, a high electron mobility transistor (HEMT) includes a channel layer including a 2-dimensional electron gas (2DEG), a channel supply layer which induces the 2DEG on the channel layer, and includes an etch stop layer and an upper layer, the upper layer including a recess region exposing the etch stop layer, a gate electrode disposed on the recess region of the channel supply layer, and a source electrode and a drain electrode respectively disposed at both sides of the gate electrode.

The recess region may be formed to an interface between the upper layer and the etch stop layer. The channel supply layer may include an aluminum gallium nitride (AlGaN) layer and an aluminum indium nitride (AlInN) layer sequentially stacked from the channel layer, the AlGaN layer may be the etch stop layer, and the AlInN layer may be the upper layer. The channel supply layer may include an AlInN layer and an AlGaN layer sequentially stacked from the channel layer, the AlInN layer may be the etch stop layer, and the AlGaN layer may be the upper layer. The channel supply layer may further include a lower layer between the channel layer and the etch stop layer.

The channel supply layer may include a first AlGaN layer, an AlInN layer, and a second AlGaN layer sequentially stacked from the channel layer, the first AlGaN layer may be the lower layer, the AlInN layer may be the etch stop layer, and the second AlGaN layer may be the upper layer. The channel supply layer may include a first AlInN layer, an AlGaN layer, and a second AlInN layer sequentially stacked from the channel layer, the first AlInN layer may be the lower layer, the AlGaN layer may be the etch stop layer, and the second AlInN layer may be the upper layer. One of the etch stop layer and the upper layer may be an AlGaN layer, and the other may be an AlInN layer. The channel supply layer may further include a lower layer between the channel layer and the etch stop layer, and the lower layer may be an AlInN layer or an AlGaN layer.

The channel supply layer may further include at least one of an aluminum nitride (AlN) layer and an aluminum indium gallium nitride (AlInGaN) layer. A thickness of the channel supply layer in the recess region may be in the range from about 1 nm to about 20 nm. The HEMT may further include a gate insulation layer between the channel supply layer and the gate electrode. The HEMT may further include a depletion layer between the channel supply layer and the gate electrode. The depletion layer may be a p-type semiconductor layer or a dielectric layer. The depletion layer may be a p-doped layer.

According to other example embodiments, a method of manufacturing a high electron mobility transistor (HEMT) includes forming a channel layer, forming a channel supply layer on the channel layer, the channel supply layer has a multilayer structure including an etch stop layer and an upper layer, forming a recess region by etching a portion of the upper layer until a surface of the etch stop layer is exposed, forming a gate electrode in the recess region of the channel supply layer, and forming a source electrode and a drain electrode respectively at both sides of the gate electrode.

The etch stop layer may be an aluminum gallium nitride (AlGaN) layer, and the upper layer may be an aluminum indium nitride (AlInN) layer. The forming of the recess region may include etching the AlInN layer by using a first etching gas, the first etching gas may include an iodine(I)-based gas. The etch stop layer may be an AlInN layer and the upper layer may be an AlGaN layer. The forming of the recess region may include etching the AlGaN layer by using a second etching gas, the second etching gas may include at least one of a fluorine(F)-based gas, a chlorine(Cl)-based gas, and a bromine(Br)-based gas. The forming of the channel supply layer may further include forming a lower layer between the channel layer and the etch stop layer.

The lower layer may be a first AlGaN layer, the etch stop layer may be an AlInN layer, and the upper layer may be a second AlGaN layer. The lower layer may be a first AlInN layer, the etch stop layer may be an AlGaN layer, and the upper layer may be a second AlInN layer. A thickness of the channel supply layer in the recess region may be in the range from about 1 nm to about 20 nm. The method may further include forming a gate insulation layer between the channel supply layer and the gate electrode. The method may further include forming a depletion layer between the channel supply layer and the gate electrode.

According to at least one example embodiment, a high electron mobility transistor (HEMT) includes a channel layer, a channel supply layer configured to induce a 2-dimensional electron gas (2DEG) in the channel layer, the channel supply layer including a first material layer and an etch stop layer, the first material layer including a recess region exposing the etch stop layer, a gate electrode on the recess region, and a source electrode and a drain electrode at sides of the gate electrode.

According to at least one example embodiment, a method of manufacturing a high electron mobility transistor (HEMT) includes forming a channel layer, forming a channel supply layer on the channel layer such that the channel supply layer includes an etch stop layer and a first material layer, forming a recess region by etching a portion of the first material layer until a surface of the etch stop layer is exposed, forming a gate electrode in the recess region, and forming a source electrode and a drain electrode at sides of the gate electrode.

BRIEF DESCRIPTION OF THE DRAWINGS

Example embodiments will be more clearly understood from the following brief description taken in conjunction with the accompanying drawings. FIGS. 1-10E represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicated like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
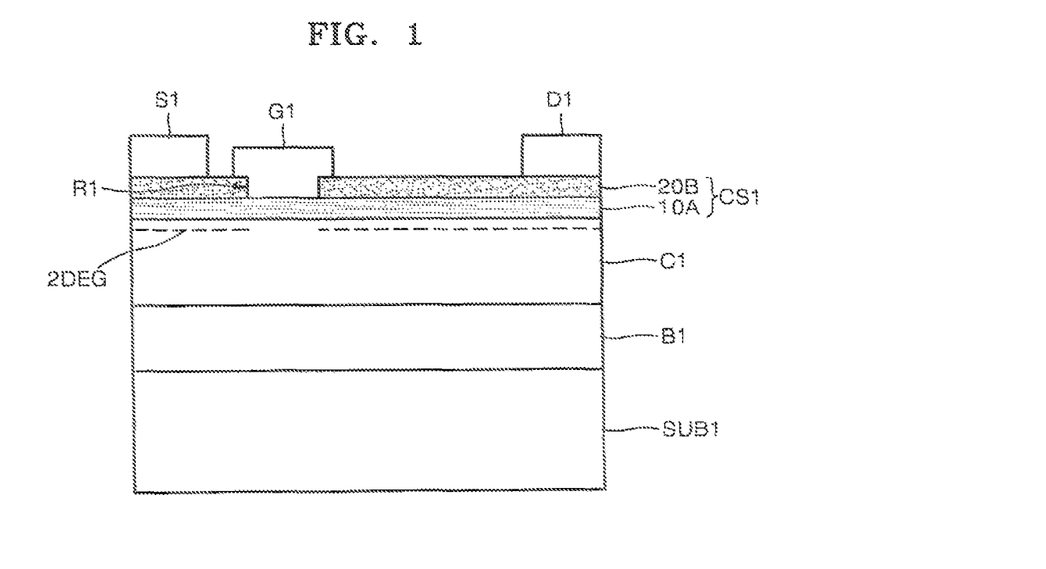
FIGS. 1-4 are cross-sectional diagrams illustrating high electron mobility transistors (HEMT) according to example embodiments.

FIG. 1 is a cross-sectional diagram illustrating HEMTs according to example embodiments. Referring to FIG. 1, a buffer layer B1 may be on a substrate SUB1. A channel layer C1 may be on the buffer layer B1. The substrate SUB1 may include, for example, silicon (Si), sapphire, silicon carbide (SiC), gallium nitride (GaN) and/or the like. The buffer layer B1 may reduce lattice constant and thermal expansion coefficient differences between the substrate SUB1 and the channel layer C1. The buffer layer B1 may prevent and/or reduce deterioration of crystallinity in the channel layer C1. The buffer layer B1 may include aluminum nitride (AlN), gallium nitride (GaN), aluminum gallium nitride (AlGaN), aluminum indium nitride (AlInN) and/or aluminum gallium indium nitride (AlGaInN), for example. When the buffer layer B1 includes aluminum (Al), the content (atomic %) of Al may be about 0 to about 30%. According to at least one example embodiment, a seed layer (not shown) may be between the substrate SUB1 and the buffer layer B1. The seed layer may be a base layer for growing the buffer layer B1.

The channel layer C1 may include a semiconductor layer. The channel layer C1 may include a compound semiconductor layer, for example, a gallium nitride (GaN) layer. The channel layer C1 may be, for example, an undoped GaN layer. According to at least one example embodiment, the channel layer C1 may be a GaN layer doped with one or more impurities. A channel supply layer CS1 may be on the channel layer C1. The channel supply layer CS1 may include a material with a different polarization characteristic from the channel layer C1. For example, the channel supply layer CS1 may include a material of higher polarizability than the channel layer C1. A 2-dimensional electron gas (2DEG) may be induced in the channel layer C1 by the channel supply layer CS1. The 2DEG may be induced in a portion of the channel layer C1 adjacent to the interface between the channel supply layer CS1 and the channel layer C1. The 2DEG may be used as an n-type channel.

The channel supply layer CS1 may be a multilayer structure including at least two material layers. For example, the channel supply layer CS1 may include an etch stop layer 10A and an upper layer 20B that may be on the etch stop layer 10A. A recess region R1 exposing the etch stop layer 10A may be in the upper layer 20B. The recess region R1 may be a region recessed to a boundary between the upper layer 20B and the etch stop layer 10A. A portion of the 2DEG corresponding to the recess region R1 may not exist. According to at least one example embodiment, a 2DEG corresponding to the recess region may exist with different characteristics (electron concentration and/or the like) than other regions of the 2DEG. A thickness of the channel supply layer CS1 in the recess region R1 may be about 1 nm to about 20 nm. According to at least one example embodiment, the thickness of the channel supply layer CS1 in the recess region R1 may correspond to a thickness of the etch stop layer 10A. The thickness of the etch stop layer 10A may be about 1 nm to about 20 nm. The thickness of the channel supply layer CS1 in regions excluding the recess region R1 may be greater than about 20 nm.

A gate electrode G1 may be on the recess region R1 of the channel supply layer CS1. The gate electrode G1 may form a Schottky contact with the channel supply layer CS1. The gate electrode G1 may include a material, for example a metal and/or a metal compound, that forms a Schottky contact with the channel supply layer CS1. According to at least one example embodiment, a Schottky contact layer (not shown) may be between the gate electrode G1 and the channel supply layer CS1. For example, the gate electrode G1 may include a p-type metal and/or a conductive nitride. The p-type metal may include nickel (Ni), iridium (Ir), platinum (Pt), and/or gold (Au), and the conductive nitride may include titanium nitride (TiN), tantalum nitride (TaN), and/or zirconium nitride (ZrN). However, such materials are only examples, and any other conductive material may be used for the gate electrode G1.

A source electrode S1 and a drain electrode D1 may be on the channel supply layer CS1, respectively at sides of the gate electrode G1. The source electrode S1 may be closer to the gate electrode G1 than the drain electrode D1. A distance between the source electrode S1 and the gate electrode G1 may be less than a distance between the drain electrode D1 and the gate electrode G1. However, relative distances between the source electrode S1 and the gate electrode G1 and between the drain electrode D1 and the gate electrode G1 may differ. The source electrode S1 and the drain electrode D1 may be in ohmic contact with the channel supply layer CS1. According to circumstances, an ohmic contact layer (not shown) may be between the source electrode S1 and the channel supply layer CS1, and between the drain electrode D1 and the channel supply layer CS1.

In the channel supply layer CS1, the etch stop layer 10A and the upper layer 20B may include different materials. For example, the etch stop layer 10A may include an AlGaN layer and the upper layer 20B may include an AlInN layer. The AlGaN layer may be an $Al_xGa_{1-x}N$ layer, where x is $0.1 \leq x \leq 0.5$. The AlInN layer may be an $Al_xIn_{1-x}N$ layer, where x is $0.5 \leq x \leq 0.9$. At least one of the AlGaN layer and the AlInN layer may be doped with an n-type impurity. The n-type impurity may be, for example, silicon (Si). Because polarizabilities of the AlGaN layer and the AlInN layer may be greater than that of a material of the channel layer C1, the 2DEG may be formed in the channel layer C1. Because an etch selectivity of the upper layer 20B may be greater than the etch stop layer 10A in the channel supply layer CS1, the recess region R1 may be only in the upper layer 20B with no or reduced damage in the etch stop layer 10A. A bottom surface of the recess region R1 may be defined as an interface between the etch stop layer 10A and the upper layer 20B. A depth of the recess region R1 may be easily controlled by the etch stop layer 10A.

Characteristics of a region of the channel layer C1 corresponding to the recess region R1 may differ according to the depth of the recess region R1, strictly speaking, according to the thickness of the channel supply layer CS1 in the recess region R1. Characteristics (e.g., threshold voltage) within the HEMT may differ. Improved, easy and/or accurate controlling of the depth of the recess region R1 may improve and/or ease controlling of the characteristics (e.g., threshold voltage) of the HEMT. If the channel supply layer CS1 is a single material layer (e.g., an AlGaN layer), or includes materials with little or no etch selectivity with respect to each other, it may be difficult to control the depth of the recess region R1.

When a single material layer (e.g., an AlGaN layer), or material layers with little or no etch selectivity with respect to each other, are etched to a depth (e.g., a target depth), it may be difficult to constantly maintain the etch depth (recess depth) based on an etch time. Etch non-uniformity may exist according to regions of a wafer (substrate), and etch characteristics may change every time (e.g., from batch to batch) even if an etch process is performed under the same conditions. When a channel supply layer CS1 is formed of a single material layer and or of multiple layers with little or no etch selectivity with respect to each other, it may be difficult to uniformly maintain the depth of the recess region R1 to control the characteristics of the HEMT. According to example embodiments, when the channel supply layer CS1 includes an etch stop layer 10A and an upper layer 20B, the depth of the recess region R1 in the upper layer 20B may be easily controlled and/or the control may be improved (e.g., by using an etch stop layer 10A). The thickness of the channel supply layer CS1 in the recess region R1 may be uniformly maintained. Device characteristics, for example threshold voltage, of the HEMT may be easily controlled and/or control may be improved.

The threshold voltage of the HEMT may be increased by the recess region R1. The HEMT according to some example embodiments may be a normally-off device operating in an enhancement mode (E-mode). An E-mode HEMT may operate better, require less power and/or provide other benefits in various circuit structures than a depletion mode (D-mode) HEMT. A breakdown voltage of the HEMT may increase in relation to the changing of the characteristics of the 2DEG by the recess region R1. The withstand voltage performance of the HEMT may be improved (reinforced) by the recess region R1. A HEMT with excellent and/or improved performance may be realized.

Figure 2:
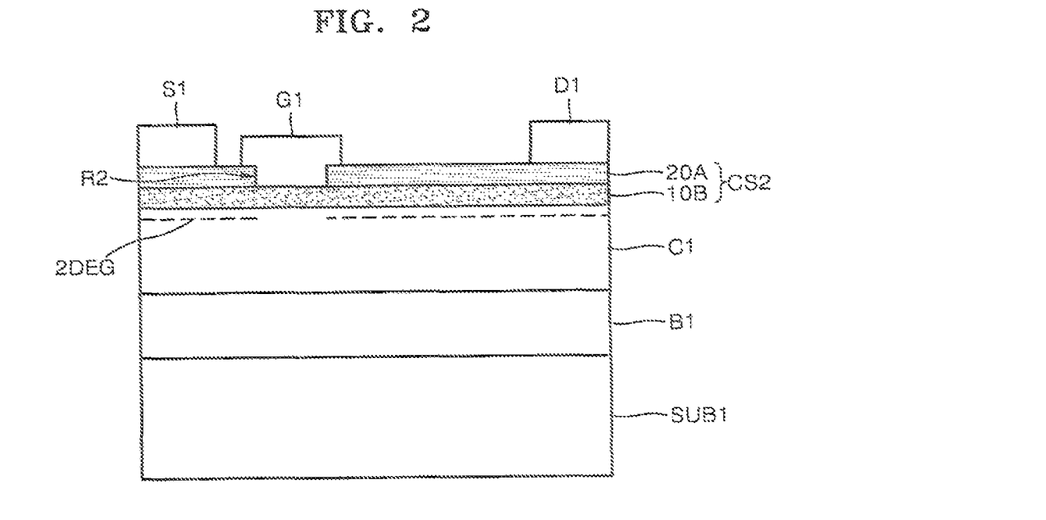

FIG. 2 is a cross-sectional diagram illustrating HEMTs according to other example embodiments. HEMTs according to example embodiments illustrated in FIG. 2 may be different from the HEMTs according to example embodiments illustrated in FIG. 1 with respect to a structure of a channel supply layer. Referring to FIG. 2, the channel supply layer CS2 may include an etch stop layer 10B and an upper layer 20A. A recess region R2 exposing the etch stop layer 10B may be in the upper layer 20A. The recess region R2 may be a region recessed to a boundary between the upper layer 20A and the etch stop layer 10B. In the channel supply layer CS2, the etch stop layer 10B may include an AlInN layer and the upper layer 20A may include an AlGaN layer. The AlInN layer and the AlGaN layer may be respectively identical and/or similar to the AlInN layer and the AlGaN layer described above with reference to FIG. 1. The AlInN layer may be a doped or undoped $Al_xIn_{1-x}N$ layer ($0.5 \leq x \leq 0.9$), and the AlGaN layer may be a doped or undoped $Al_xGa_{1-x}N$ layer ($0.1 \leq x \leq 0.5$). For example, the AlInN layer and/or the AlGaN layer may be a layer doped with an n-type impurity. If the channel supply layer CS1 of FIG. 1 with a structure of AlGaN layer/AlInN layer, the channel supply layer CS2 of FIG. 2 may have a reverse structure of the channel supply layer CS1 of FIG. 1 (e.g., an AlInN layer/AlGaN layer structure).

Because etch selectivity of the AlGaN layer with respect to the AlInN layer may exist according to a type of etch gas (e.g., etch selectivity may be high), the AlInN layer may be used as the etch stop layer 10B, and the AlGaN layer may be used as the upper layer 20A. The recess region R2 may be only in the upper layer 20A while and the etch stop layer 10B may not be damaged or the damage may be reduced. According to at least one example embodiment, a thickness of the channel supply layer CS2 in the recess region R2 may be about 1 nm to about 20 nm, and a thickness of the channel supply layer CS2 in other regions excluding the recess region R2 may be greater than about 20 nm.

Figure 3:
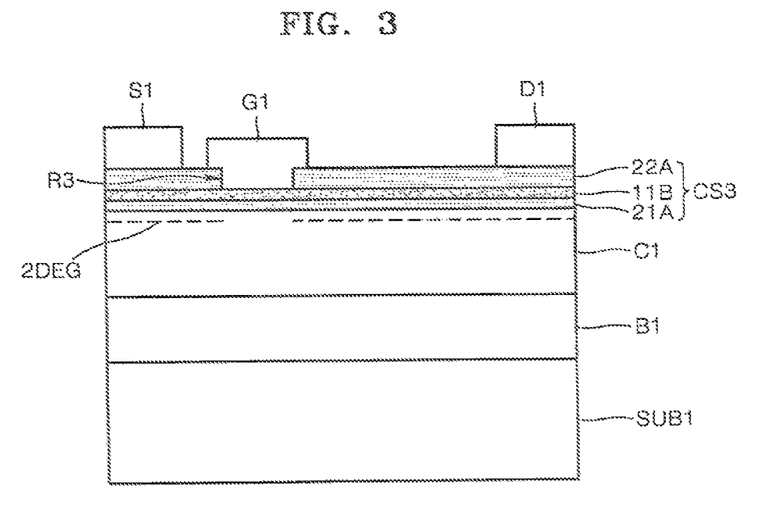

FIG. 3 is a cross-sectional diagram illustrating HEMTs according to still other example embodiments. HEMTs according to example embodiments illustrated in FIG. 3 may be different from the HEMTs according to example embodiments illustrated in FIG. 2 with respect to a structure of a channel supply layer. Referring to FIG. 3, the channel supply layer CS3 may include a three-layer structure. For example, the channel supply layer CS3 may include a lower layer 21A, an etch stop layer 11B, and an upper layer 22A, which may be stacked (e.g., sequentially stacked) on the channel layer C1. A recess region R3 may be in the upper layer 22A up to an interface between the etch stop layer 11B and the upper layer 22A.

The lower layer 21A, the etch stop layer 11B, and the upper layer 22A may include, for example, a first AlGaN layer, an AlInN layer, and a second AlGaN layer, respectively. The first and second AlGaN layers may be identical and/or similar to the AlGaN layer described with reference to FIG. 1, and the AlInN layer may be identical and/or similar to the AlInN layer described with reference to FIG. 1. A sum thickness of the lower layer 21A and etch stop layer 11B of FIG. 3 may be similar to the thickness of the etch stop layer 10A and/or 10B of FIGS. 1 and 2. A thickness of the channel supply layer CS3 in the recess region R3 may be about 1 nm to about 20 nm. A thickness of the channel supply layer CS3 in other regions excluding the recess region R3 may be greater than about 20 nm.

Figure 4:
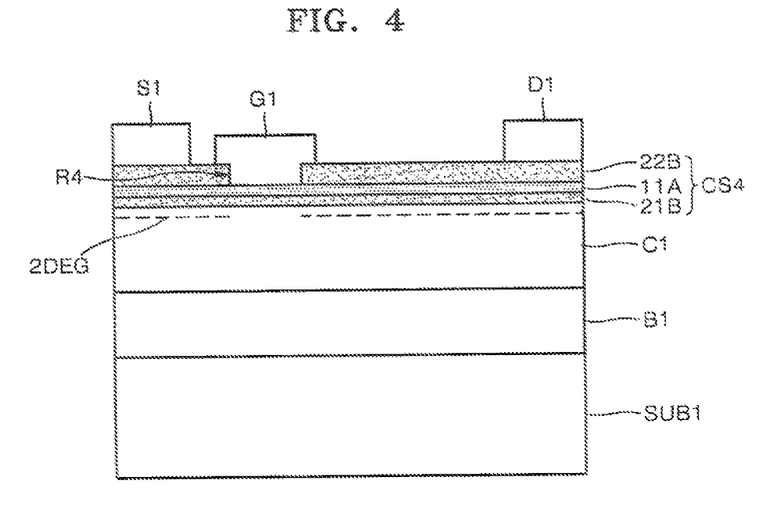

FIG. 4 is a cross-sectional diagram illustrating HEMTs according to yet still other example embodiments. HEMTs according to example embodiments illustrated in FIG. 4 may be different from the HEMTs illustrated according to example embodiments in FIG. 3 with respect to a structure of a channel supply layer. Referring to FIG. 4, a channel supply layer CS4 may include a lower layer 21B, an etch stop layer 11A, and an upper layer 22B, which may be stacked (e.g., sequentially stacked) on the channel layer C1. The lower layer 21B, the etch stop layer 11A, and the upper layer 22B may include, for example, a first AlInN layer, an AlGaN layer, and a second AlInN layer, respectively. The first and second AlInN layers may be identical or similar to the AlInN layer described with reference to FIG. 1, and the AlGaN layer may be identical or similar to the AlGaN layer described with reference to FIG. 1. A sum thickness of the lower layer 21B and the etch stop layer 11A of FIG. 4 may be similar to the thickness of the etch stop layer 10A and/or 10B of FIG. 1 or 2. A thickness of the channel supply layer CS4 in a recess region R4 may be about 1 nm to about 20 nm. A thickness of the channel supply layer CS4 in other regions excluding the recess region R4 may be greater than about 20 nm.

The characteristics of the HEMT may be easily and accurately controlled, an/or the control may be improved, because the depth of the recess region R3 and/or R4 may be easily and accurately controlled, and/or the control may be improved, by the etch stop layer 11B or 11A of FIG. 3 or 4 (control of the thickness of the channel supply layer CS3 or CS4 in the recess region R3 or R4 may be easy, accurate and/or improved). The structures of the HEMTs illustrated in FIGS. 1-4 may be variously changed. For example, the HEMTs illustrated in FIGS. 1-4 may include a gate insulation layer between the gate electrode G1 and the channel supply layers CS1-CS4.

Figure 5:
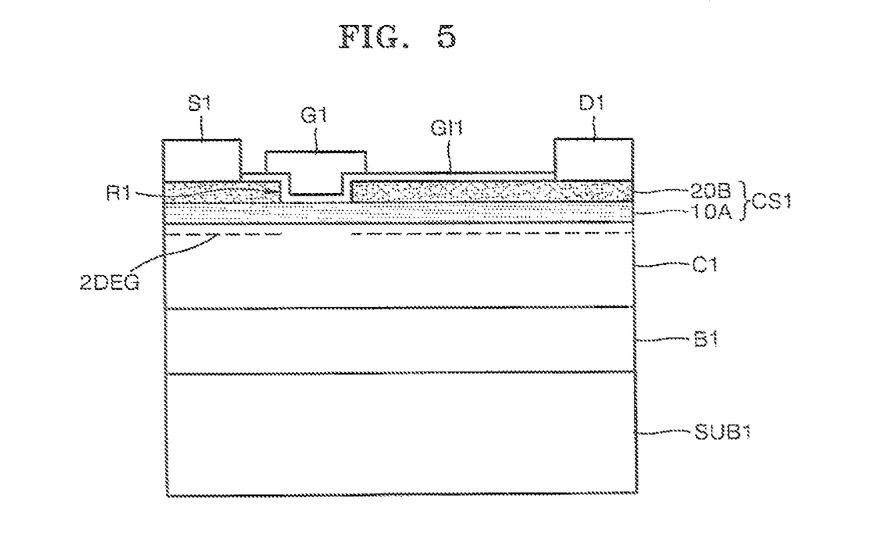
FIGS. 5 and 6 are cross-sectional diagrams illustrating HEMTs according to other example embodiments.
Figure 6:
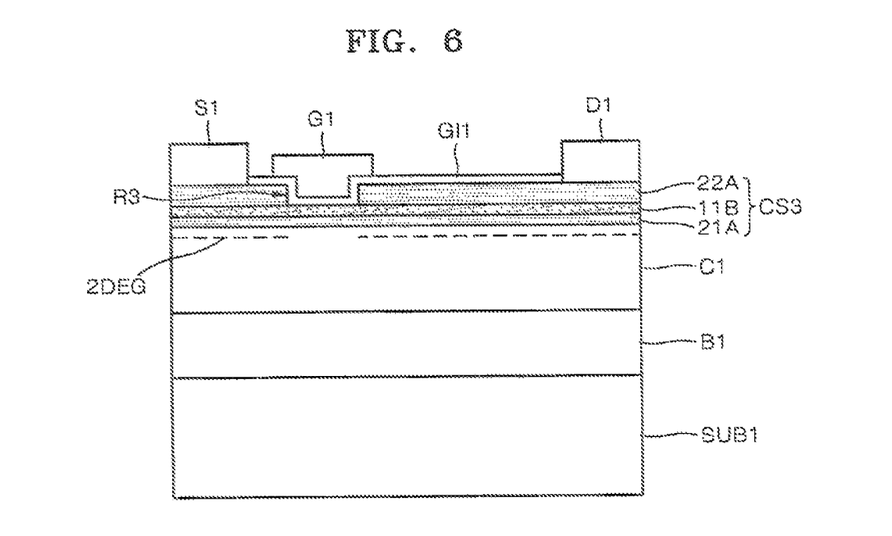

FIGS. 5 and 6 are cross-sectional diagrams illustrating HEMTs according to other example embodiments. FIGS. 5 and 6 illustrate structures of HEMTs illustrated in FIGS. 1 and 3, respectively, and including a gate insulation layer GI1. The gate insulation layer GI1 may extend up to the source electrode S1 and the drain electrode D1 from between the gate electrode G1 and the channel supply layers CS1 and CS3. The gate insulation layer GI1 may include, for example, $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, and/or a combination thereof.

Although not described herein, any material used to form a gate insulation layer that may be used in a general transistor may be used for the gate insulation layer GI1. When the gate insulation layer GI1 is used, it may not be required for the gate electrode G1 to form a Schottky contact with the channel supply layers CS1 and CS3, and the number of materials (conductors) that may be used for the gate electrode G1 may be greater than when Schottky contact is used. The gate electrode G1 may include the same or similar material to the source and drain electrodes S1 and D1. Although not shown, the gate insulation layer GI1 may be applied to the HEMTs of FIGS. 2 and 4. According to some example embodiments, the HEMTs of FIGS. 1-4 may include a depletion layer between the gate electrode G1 and the channel supply layers CS1-CS4.

Figure 7:
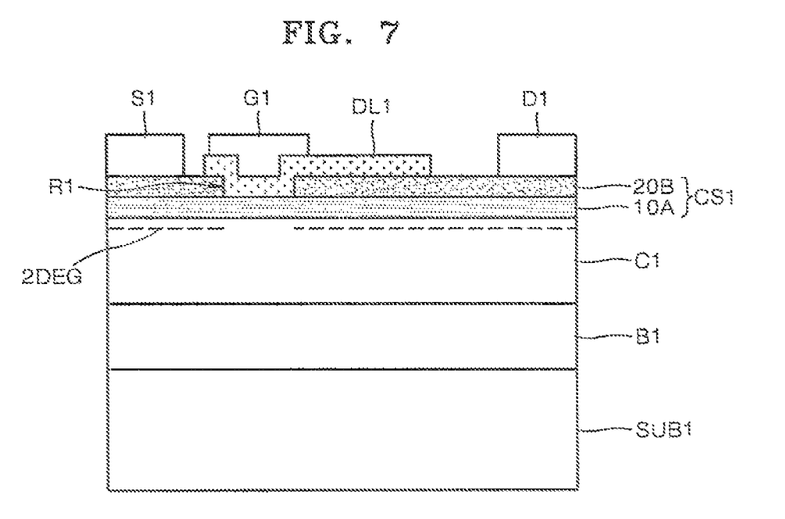
FIGS. 7 and 8 are cross-sectional diagrams illustrating HEMTs according to still other example embodiments.
Figure 8:
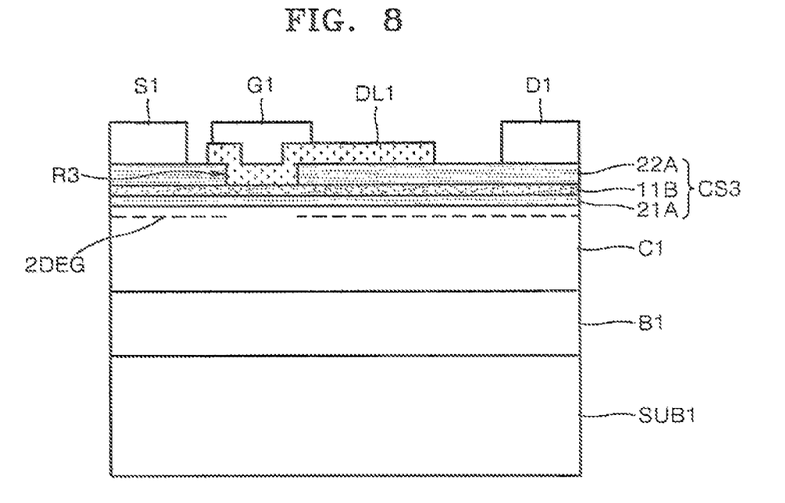

FIGS. 7 and 8 are cross-sectional diagrams illustrating HEMTs according to still other example embodiments. FIGS. 7 and 8 respectively show structures of HEMTs of FIGS. 1 and 3 including a depletion layer DL1. The depletion layer DL1 may extend towards the source electrode S1 and the drain electrode D1 from between the gate electrode G1 and the channel supply layers CS1 and CS3. According to at least one example embodiment, the depletion layer DL1 may not contact the source and drain electrodes S1 and D1. According to at least one example embodiment, according to circumstances, the depletion layer DL1 may contact the source and drain electrodes S1 and D1. The depletion layer DL1 may be, for example, a p-type semiconductor layer and/or a dielectric layer, and/or the depletion layer DL1 may be a layer doped with a p-type impurity (e.g., a p-doped layer).

The depletion layer DL1 may include, for example, GaN, InN, AlGaN, AlInN, InGaN and/or AlInGaN, and may be doped with a p-type impurity (e.g., Mg). A thickness of the depletion layer DL1 may be about 50 nm to about 200 nm. The depletion layer DL1 may adjust characteristics of a region of the channel layer C1 corresponding to the recess regions R1 and R3. Because the depletion layer DL1 may increase energy bands of the channel supply layers CS1 and CS3, energy levels of the channel supply layers CS1 and CS3 may be increased by the depletion layer DL1. The depletion layer DL1 may deplete the 2DEG in the regions of the channel layer C1 corresponding to the recess regions R1 and R3. The 2DEG in the regions of the channel layer C1 corresponding to the regions of the channel supply layer CS1 and CS3 excluding (e.g., outside of) the recess regions R1 and R3 may not be depleted by the depletion layer DL1.

Because the channel supply layers CS1 and CS3 may be thick in the regions excluding the recess regions R1 and R3, the influence of the depletion layer DL1 in the channel layer C1 may be relatively small. According to example embodiments, electric characteristics of the regions of the channel layer C1 corresponding to the recess regions R1 and R3 may be adjusted by a recess and by the depletion layer DL1. The depletion layer DL1 may suppress and/or reduce electric field concentration on the gate electrode G1 due to space charge. The characteristics of the HEMTs may be improved by the depletion layer DL1. The depletion layer DL1 may be applied to, for example, other HEMTs (e.g., the HEMTs of FIGS. 2 and 4).

The channel supply layers CS1-CS4 may include at least one AlGaN layer and at least one AlInN layer according to example embodiments. According to at least one example embodiment, for example, the channel supply layers CS1 and CS4 may further include a material layer other than an AlGaN layer and an AlInN layer. In the HEMTs of FIGS. 1-8, the channel supply layers CS1-CS4 may include at least one material layer, for example, an AlN layer or an AlInGaN layer. The channel supply layer CS1 of FIG. 1 may further include an AlN layer between the etch stop layer 10A and the channel layer C1. Other modifications may be possible.

Figure 9A:
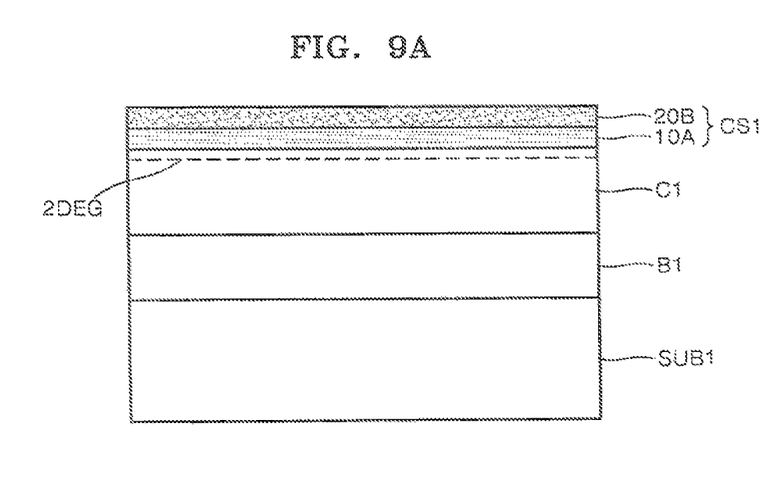
FIGS. 9A-9E are cross-sectional diagrams illustrating methods of manufacturing HEMTs according to further example embodiment.

FIGS. 9A-9E are cross-sectional diagrams illustrating methods of manufacturing HEMTs according to example embodiments. Referring to FIG. 9A, a buffer layer B1 may be formed on a substrate SUB1. The substrate SUB1 may be a substrate including, for example, Si, sapphire, SiC and/or GaN. The buffer layer B1 may include, for example, AlN, GaN, AlGaN, AlInN and/or AlGaInN. When the buffer layer B1 includes Al, the content (atomic %) of Al may be about 0 to about 30%. According to circumstances, a seed layer (not shown) may be formed between the substrate SUB1 and the buffer layer B1. A channel layer C1 may be formed on the buffer layer B1. For example, the channel layer C1 may be formed of a compound semiconductor (e.g., GaN). The channel layer C1 may be an undoped GaN layer, or according to circumstances, a GaN layer doped with one or more impurities. A channel supply layer CS1 may be formed on the channel layer C1.

The channel supply layer CS1 may include a material with different polarization characteristics from the channel layer C1. For example, the channel supply layer CS1 may include a material of higher polarizability than the channel layer C1. The 2DEG may be induced in the channel layer C1 by the channel supply layer CS1. The channel supply layer CS1 may be a multilayer structure including a plurality of different material layers. For example, the channel supply layer CS1 may include an etch stop layer 10A and an upper layer 20B. The etch stop layer 10A may be an AlGaN layer and the upper layer 20B may be an AlInN layer. The AlGaN layer may be an $Al_xGa_{1-x}N$ layer, where x may be $0.1 \leq x \leq 0.5$. The AlInN layer may be an $Al_xIn_{1-x}N$ layer, where x may be $0.5 \leq x \leq 0.9$. The AlGaN layer and/or the AlInN layer may be a layer doped with an n-type impurity. The n-type impurity may be, for example, Si. The thickness of the etch stop layer 10A may be from about 1 nm to about 20 nm, and the thickness of the upper layer 20B may be from several to several hundreds of nanometers.

Figure 9B:
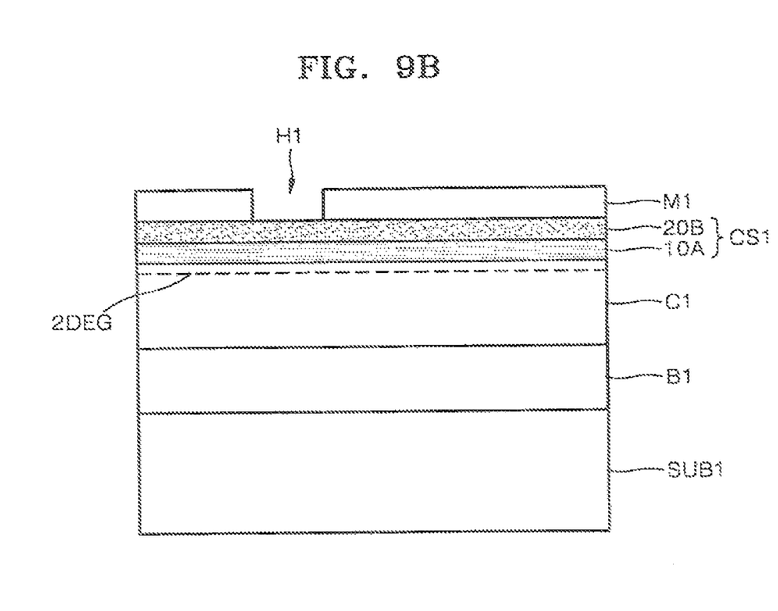
Figure 9C:
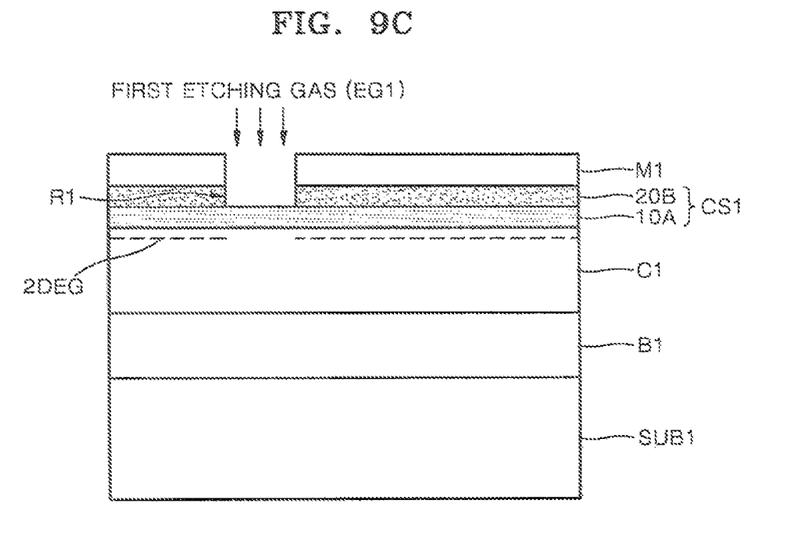

Referring to FIG. 9B, an etch mask M1 may be formed on the channel supply layer CS1. The etch mask M1 may include a hole H1 exposing a region of the channel supply layer CS1. Referring to FIG. 9C, for example, an etch process may be performed on the upper layer 20B of the channel supply layer CS1 by using a first etch gas EG1. A portion of the upper layer 20B corresponding to the hole H1 of the etch mask M1 may be etched, and thus the recess region R1 may be formed. When the upper layer 20B is an AlInN layer and the etch stop layer 10A is an AlGaN layer, the first etch gas EG1 may include, for example, an iodine(I)-based gas. The first etch gas EG1 may include at least one of ICl, $I_2$ and IBr, for example. When the first etch gas EG1 including the iodine (I)-based gas is used, the etch selectivity of the upper layer 20B (e.g., AlInN layer) with respect to the etch stop layer 10A (e.g., AlGaN layer) may be high, and the etch process may be stopped when the etch stop layer 10A is exposed.

Because the materials of the etch stop layer 10A and the upper layer 20B are different from each other, a point when the etching of the upper layer 20B may be completed (e.g., an end point) may be determined (e.g., easily determined). An etch end point of a target material (the upper layer 20B) may be detected. For example, when a change of detection amount of In constituting an element of the upper layer 20B is measured during the etch process, a point where In may no longer be detected may be a point when the etching of the upper layer 20B is completed. According to example embodiments, the point when the etching of the upper layer 20B is completed and the etch stop layer 10A is exposed may be easily determined, and the etch process may be stopped at this point.

Figure 9D:
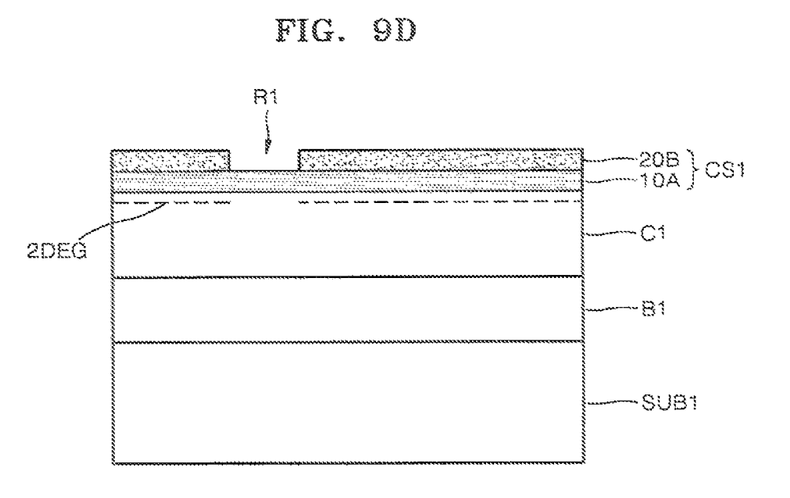
Figure 9E:
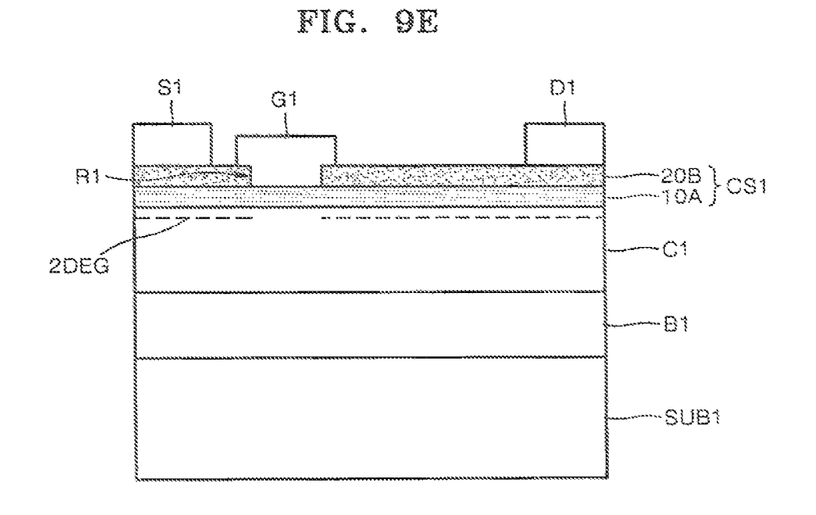

The etch mask M1 may be removed as shown in FIG. 9D. For example, the etch mask M1 may be removed after forming the recess region R1. Referring to FIG. 9E, a gate electrode G1 may be formed in and on the recess region R1, and a source electrode S1 and a drain electrode D1 may be respectively formed on the channel supply layer CS1 at sides of the gate electrode C1. The source and drain electrodes S1 and D1 may be formed, for example, after forming the gate electrode G1, or vice versa. When the materials of the etch stop layer 10A and the upper layer 20B are changed, a type of the etching gas may be changed accordingly.

Figure 10A:
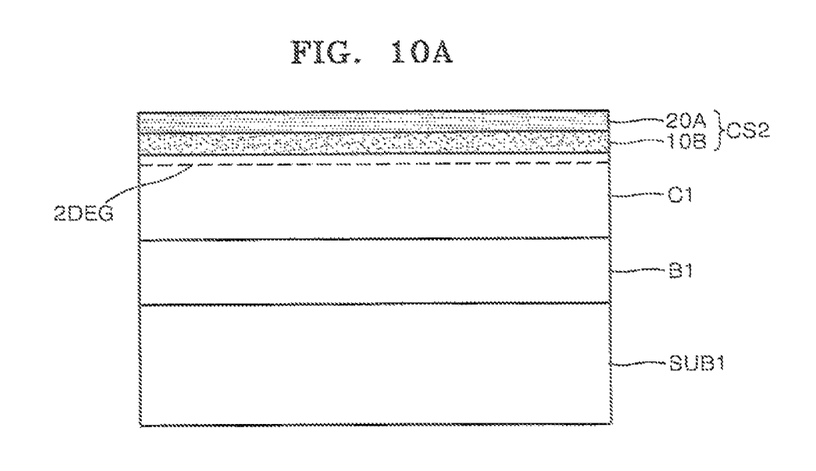
FIGS. 10A-10E are cross-sectional diagrams illustrating methods of manufacturing HEMTs according to yet further example embodiments.

Referring to FIG. 10A, a buffer layer B1, a channel layer C1 and a channel supply layer CS2 may be formed (e.g., sequentially formed) on a substrate SUB1. The substrate SUB1, the buffer layer B1, and the channel layer C1 may be identical to the substrate SUB1, the buffer layer B1, and the channel layer C1, respectively, of FIG. 9A. The channel supply layer CS2 may include the etch stop layer 10B and the upper layer 20A. For example, the etch stop layer 10B may be an AlInN layer and the upper layer 20A may be an AlGaN layer. The AlInN layer and the AlGaN layer may be identical or similar to the AlInN layer and the AlGaN layer described with reference to FIG. 9A. The AlInN layer and/or the AlGaN layer may be, for example, a layer doped with an n-type impurity. The thickness of the etch stop layer 10B may be about 1 nm to about 20 nm, and the thickness of the upper layer 20A may be several to several hundreds of nm.

Figure 10B:
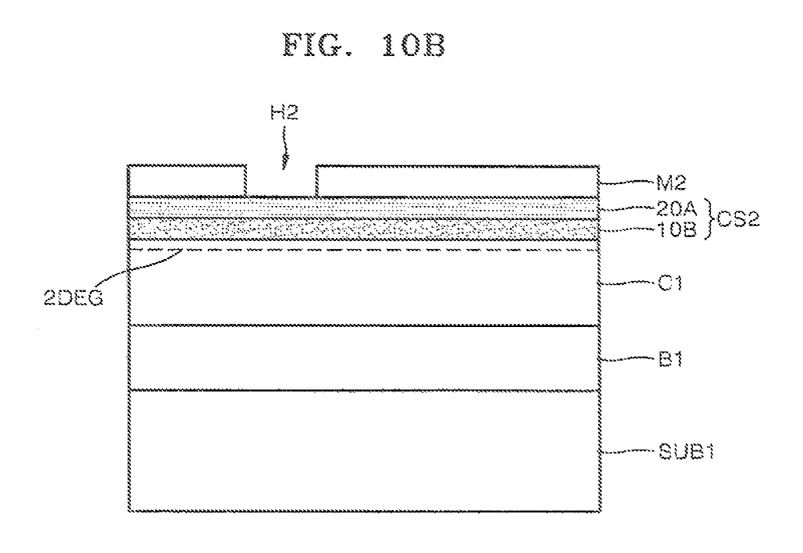
Figure 10C:
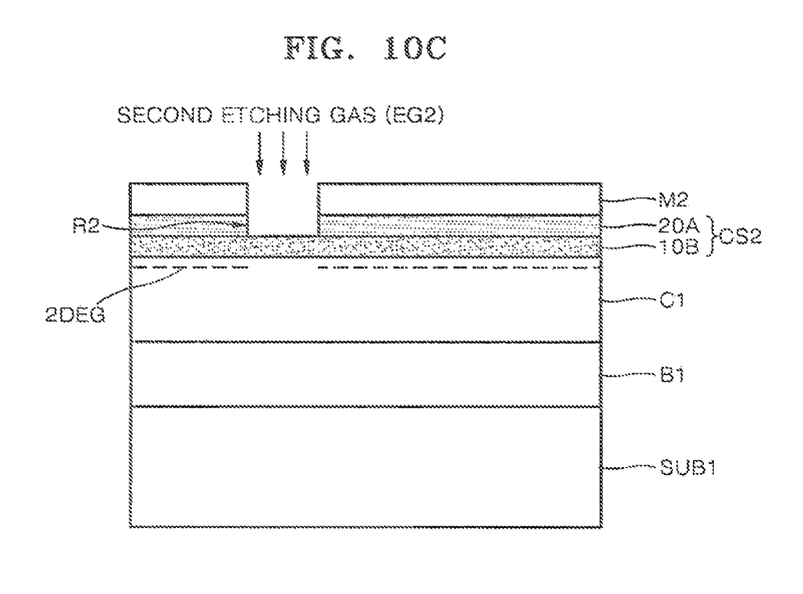

Referring to FIG. 10B, an etch mask M2 may be formed on the channel supply layer CS2. The etch mask M2 may include a hole H2 exposing a predetermined region of the channel supply layer CS2. Referring to FIG. 10C, an etch process may be performed on the upper layer 20A of the channel supply layer CS2 by using a second etch gas EG2. A region of the upper layer 20A corresponding to the hole H2 of the etch mask M2 may be etched, and the recess region R2 may be formed. When the upper layer 20A is an AlGaN layer and the etch stop layer 10B is an AlInN layer, the second etch gas EG2 may include a fluorine(F)-based gas, a chlorine(Cl)-based gas and/or a bromine(Br)-based gas. The second etch gas EG2 may include $SF_6$, $CF_4$, $CHF_3$, $BCl_3$ and/or HBr, for example.

Figure 10D:
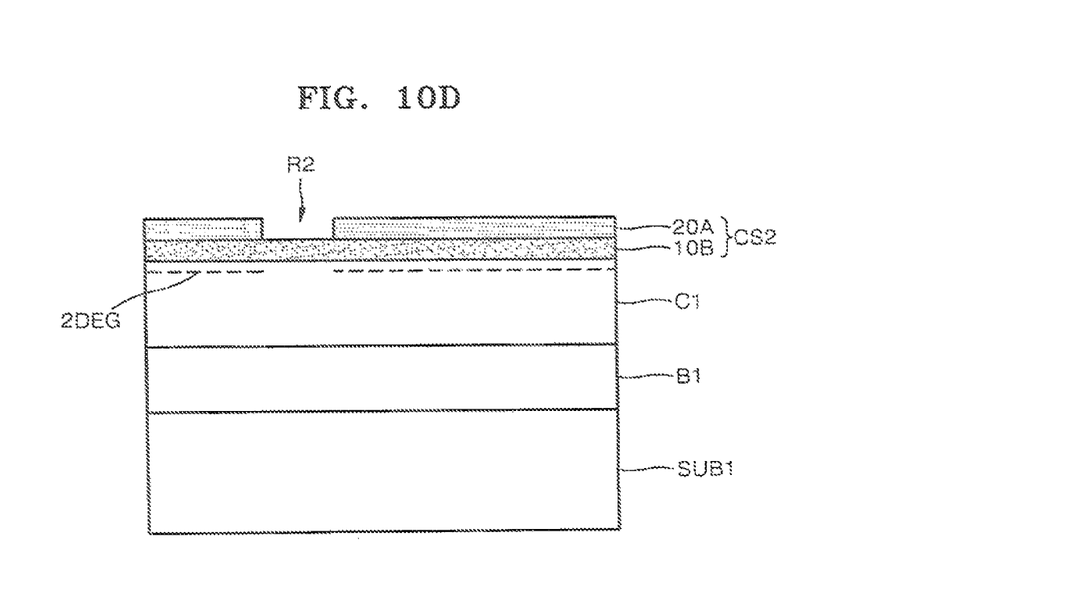
Figure 10E:
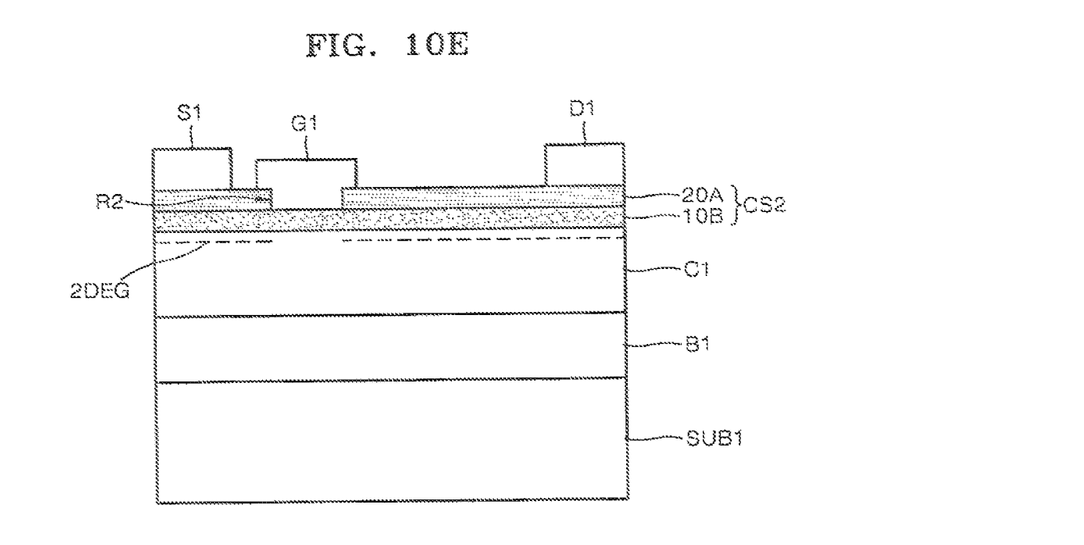

When the second etch gas EG2 is used, the etch selectivity of the upper layer 20A (AlGaN layer) with respect to the etch stop layer 10B (AlInN layer) is high, and the etch process may be stopped when the etch stop layer 10B is exposed. Because the materials of the etch stop layer 10B and the upper layer 20A are different from each other, a point when the etching of the upper layer 20A is completed (e.g., an end point) may be determined (e.g., easily determined). The etch mask M2 may be removed as shown in FIG. 10D, for example, after forming the recess region R2. As shown in FIG. 10E, a gate electrode G1 may be formed on the recess region R2, and source and drain electrodes S1 and D1 may be respectively formed on the channel supply layer CS2 at sides of the gate electrode G1.

In the methods described with respect to FIGS. 9A-9E and FIGS. 10A-10E, the etch processes performed on the upper layers 20A and 20B may be performed by using, for example, any dry etch method. For example, an inductively coupled plasma (ICP) method, an electron cyclotron resonance (ECR) method and/or a magnetically enhanced reactive ion etching (MERIE) method. When intensity of source power of plasma and intensity of radio frequency (RF) power that is applied to a substrate is adjusted, an etch rate of the upper layers 20A and 20B may be adjusted. The etch rate of the upper layers 20A and 20B may be adjusted by adjusting the concentration of an etch gas.

The methods of FIGS. 9A-9E and FIGS. 10A-10E may be variously modified. For example, a lower layer may be formed between the channel layer C1 and the etch stop layers 10A and 10B. The lower layer may be, for example, an AlGaN layer and/or an AlInN layer. According to example embodiments, a channel supply layer may be, for example, a structure of AlGaN layer/AlInN layer/AlGaN layer and/or of AlInN layer/AlGaN layer/AlInN layer. An uppermost layer (AlGaN layer and/or AlInN layer) of the channel supply layer may be etched as described above with reference to FIGS. 9C and 10C. The methods according to example embodiments may include forming a gate insulation layer and/or a depletion layer between the gate electrode G1 and the channel supply layers CS1 and CS2. The gate insulation layer and the depletion layer may be, for example, identical and/or similar to the gate insulation layer GI1 of FIG. 5 and the depletion layer DL1 of FIG. 7, respectively. The methods may be variously modified.

It should be understood that the example embodiments described therein should be considered in a descriptive sense only and not for purposes of limitation. For example, it would be apparent to one of ordinary skill in the art in possession of example embodiments that the structures of the HEMTs of FIGS. 1-8 may be variously modified. For example, various materials other than AlGaN and AlInN may be used for a lower layer, an etch stop layer, and an upper layer included in a channel supply layer, and a material other than GaN may be used for a channel layer. In addition, the methods of FIGS. 9A-9E and 10A-10E may be variously changed. Further, it would be obvious to one of ordinary skill in the art that an idea of the present invention may be applied to a semiconductor device, other than the HEMT. Therefore, the scope of the invention is defined not by the detailed description of the invention but by the appended claims.

While example embodiments have been particularly shown and described, it will be understood by one of ordinary skill in the art that variations in form and detail may be made therein without departing from the spirit and scope of the claims.

What is claimed is:

1. A high electron mobility transistor (HEMT), comprising:
   a channel layer;
   a channel supply layer configured to induce a 2-dimensional electron gas (2DEG) in the channel layer, the channel supply layer including a first material layer and an etch stop layer, the first material layer including a recess region exposing the etch stop layer, a thickness of the channel supply layer in the recess region being less than 20 nm, and a portion of the 2DEG corresponding to the recess region does not exist due to the thickness of the channel supply layer in the recess region;
   a gate electrode on the recess region; and
   a source electrode and a drain electrode at respective sides of the gate electrode, wherein
   one of the etch stop layer and the first material layer is an $Al_xGa_{1-x}N$ layer, where x is $0.1 \leq x < 0.5$; and
   the other of the etch stop layer and the first material layer is an $Al_yIn_{1-y}N$ layer, where y is $0.5 \leq y \leq 0.9$ and v is greater than x.

2. A high electron mobility transistor (HEMT), comprising:
   a channel layer;
   a channel supply layer configured to induce a 2-dimensional electron gas (2DEG) in the channel layer, the channel supply layer including a first material layer and an etch stop layer, the first material layer including a recess region exposing the etch stop layer;
   a gate electrode on the recess region; and a source electrode and a drain electrode at respective sides of the gate electrode, wherein one of the etch stop layer and the first material layer is a first aluminum gallium nitride (AlGaN) layer, the first AlGaN layer being an $Al_xGa_{1-x}N$ layer, where x is $0.1 \leq x < 0.5$; and the other of the etch stop layer and the first material layer is a first aluminum indium nitride (AlInN) layer, the first AlInN layer being an $Al_yIn_{1-y}N$ layer, where y is $0.5 \leq y \leq 0.9$ and y is greater than x.

3. The HEMT of claim 2, wherein a surface exposed by the recess region is contiguous with an interface between the first material layer and the etch stop layer.

4. The HEMT of claim 2, wherein
the etch stop layer is the first aluminum gallium nitride (AlGaN) layer;
the first material layer is the first aluminum indium nitride (AlInN) layer; and
the etch stop layer is between the first material layer and the channel layer.

5. The HEMT of claim 2, wherein
the etch stop layer is the first aluminum indium nitride (AlInN) layer;
the first material layer is the first aluminum gallium nitride (AlGaN) layer; and
the etch stop layer is between the first material layer and the channel layer.

6. The HEMT of claim 2, wherein the channel supply layer includes a second material layer between the channel layer and the etch stop layer.

7. The HEMT of claim 6, wherein
the first material layer is the first aluminum gallium nitride (AlGaN) layer;
the etch stop layer is the first aluminum indium nitride (AlInN) layer;
the second material layer is a second AlGaN layer; and
the etch stop layer and the second material layer are between the first material layer and the channel layer.

8. The HEMT of claim 6, wherein
the first material layer is the first aluminum indium nitride (AlInN) layer;
the etch stop layer is the first aluminum gallium nitride (AlGaN) layer;
the second material layer is a second AlInN layer; and
the etch stop layer and the second material layer are between the first material layer and the channel layer.

9. The HEMT of claim 2, wherein
the channel supply layer includes a second material layer between the channel layer and the etch stop layer; and
the second material layer is one of a second AlInN layer and a second AlGaN layer.

10. The HEMT of claim 2, wherein the channel supply layer further includes at least one additional layer, the at least one additional layer includes at least one of an aluminum nitride (AlN) layer and an aluminum indium gallium nitride (AlInGaN) layer.

11. The HEMT of claim 2, further comprising:
a gate insulation layer between the channel supply layer and the gate electrode.

12. The HEMT of claim 2, further comprising:
a depletion layer between the channel supply layer and the gate electrode.

13. The HEMT of claim 12, wherein the depletion layer is one of a p-type semiconductor layer and a dielectric layer.

14. The HEMT of claim 12, wherein the depletion layer is a p-doped layer.

15. A method of manufacturing a high electron mobility transistor (HEMT), the method comprising:
forming a channel layer;
forming a channel supply layer on the channel layer such that the channel supply layer includes an etch stop layer and a first material layer, the channel supply layer configured to induce a 2-dimensional electron gas (2DEG) in the channel layer, wherein one of the etch stop layer and the first material layer is a first aluminum gallium nitride (AlGaN) layer, the first AlGaN layer being an $Al_xGa_{1-x}N$ layer where x is $0.1 \leq x < 0.5$; and the other of the etch stop layer and the first material layer is a first aluminum indium nitride (AlInN) layer, the first AlInN layer being an $Al_yIn_{1-y}N$ layer, where y is $0.5 \leq y \leq 0.9$ and y is greater than x;
forming a recess region by etching a portion of the first material layer until a surface of the etch stop layer is exposed;
forming a gate electrode in the recess region; and
forming a source electrode and a drain electrode at respective sides of the gate electrode.

16. The method of claim 15, wherein
the etch stop layer is the first aluminum gallium nitride (AlGaN) layer; and
the first material layer is the first aluminum indium nitride (AlInN) layer.

17. The method of claim 16, wherein the forming a recess region includes etching the first AlInN layer using an etch gas including an iodine(I)-based gas.

18. The method of claim 15, wherein
the etch stop layer is the first AlInN layer; and
the first material layer is the first AlGaN layer.

19. The method of claim 18, wherein the forming a recess region includes etching the first AlGaN layer using an etch gas including at least one of a fluorine(F)-based gas, a chlorine(Cl)-based gas, and a bromine(Br)-based gas.

20. The method of claim 15, wherein the forming a channel supply layer includes forming a second material layer between the channel layer and the etch stop layer.

21. The method of claim 20, wherein
the first material layer is the first AlGaN layer;
the etch stop layer is the first AlInN layer; and
the second material layer is a second AlGaN layer.

22. The method of claim 20, wherein
the first material layer is the first AlInN layer;
the etch stop layer is the first AlGaN layer; and
the second material layer is a second AlInN layer.

23. The method of claim 15, wherein a thickness of the channel supply layer in the recess region is about 1 nm to about 20 nm.

24. The method of claim 15, further comprising:
forming a gate insulation layer between the channel supply layer and the gate electrode.

25. The method of claim 15, further comprising:
forming a depletion layer between the channel supply layer and the gate electrode.

* * * * *